US012242678B2

(12) United States Patent
Stoia

(10) Patent No.: US 12,242,678 B2
(45) Date of Patent: Mar. 4, 2025

(54) SYSTEM FOR TRANSMITTING OBJECT RELATED DATA FROM A BASE UNIT TO A MOBILE UNIT THROUGH A PERSON'S BODY

(71) Applicant: Microchip Technology Incorporated, Chandler, AZ (US)

(72) Inventor: Valentin Stoia, Bucharest (RO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/228,084

(22) Filed: Jul. 31, 2023

(65) Prior Publication Data

US 2024/0053839 A1 Feb. 15, 2024

Related U.S. Application Data

(60) Provisional application No. 63/397,246, filed on Aug. 11, 2022.

(51) Int. Cl.
*G06F 3/044* (2006.01)
*G06F 3/0362* (2013.01)
*G06F 3/16* (2006.01)

(52) U.S. Cl.
CPC ............. *G06F 3/0362* (2013.01); *G06F 3/16* (2013.01); *G06F 2203/04101* (2013.01); *G06F 2203/04108* (2013.01)

(58) Field of Classification Search
CPC ................................. G06F 3/0362; G06F 3/16
See application file for complete search history.

(56) References Cited

U.S. PATENT DOCUMENTS

2006/0281406 A1  12/2006  Ishibashi et al. ............. 455/41.1
2007/0105588 A1*  5/2007  Issa .......................... H04L 67/52
                                                         455/556.1

(Continued)

FOREIGN PATENT DOCUMENTS

WO  WO-2016046405 A1 *  3/2016  ............... H04B 1/40

OTHER PUBLICATIONS

International Search Report and Written Opinion, Application No. PCT/US2023/030032, 15 pages, Oct. 26, 2023.

*Primary Examiner* — Sanghyuk Park
(74) *Attorney, Agent, or Firm* — SLAYDEN GRUBERT BEARD PLLC

(57) ABSTRACT

A system includes a base unit associated with an object, and a mobile unit carriable by a person. The base unit includes a base unit capacitive coupling element providing a base unit-human capacitive coupling between the base unit and the person, and the mobile unit includes a mobile unit capacitive coupling element providing a mobile unit-human capacitive coupling between the mobile unit and the person. The base unit-human capacitive coupling and mobile unit-human capacitive coupling enable a data transmission connection between the base unit and mobile unit that passes through the person's body. Base unit transmitter circuitry of the base unit transmits object related data via the data transmission connection passing through the person's body, mobile unit receiver circuitry of the mobile unit receives the object related data, and an output device of the mobile unit outputs human-perceptible signals based on the received object related data.

14 Claims, 5 Drawing Sheets

(56) References Cited

U.S. PATENT DOCUMENTS

| | | | |
|---|---|---|---|
| 2008/0259043 A1* | 10/2008 | Buil | H04B 13/005 |
| | | | 345/173 |
| 2015/0044969 A1 | 2/2015 | Tucker | 455/41.2 |
| 2015/0149310 A1 | 5/2015 | He et al. | 705/21 |
| 2015/0301644 A1 | 10/2015 | Walley | 345/174 |
| 2016/0286338 A1* | 9/2016 | Bengtsson | G06F 3/1454 |

* cited by examiner

SYSTEM FOR TRANSMITTING OBJECT RELATED DATA FROM A BASE UNIT TO A MOBILE UNIT THROUGH A PERSON'S BODY

RELATED PATENT APPLICATION

This application claims priority to commonly owned U.S. Provisional Patent Application No. 63/397,246 filed Aug. 11, 2022, the entire contents of which are hereby incorporated by reference for all purposes.

TECHNICAL FIELD

The present disclosure relates to systems and methods for transmitting object related data from a base unit to a mobile unit through a person's body.

BACKGROUND

Conventional solutions for obtaining information about an object, for example, information about the function provided by a button, switch, or other selectable control device (actuator) are often limited. For example, information may be printed on or near the object, requiring a user to read the information. Such solutions are particularly inadequate for visually challenged people, who often struggle with actuators (e.g., buttons and switches) for elevators, intercoms, and transportation systems, as well as keyboards, appliances, and various other types of actuators.

Some actuators include relevant information (e.g., indicating the function provided by the respective control) encoded in Braille. However, Braille has various drawbacks. For example, reading Braille requires substantial learning time, Braille encoded information is often limited in scope, and Braille is often difficult to read due to factors including worn down texture (dots), small size, dirt or debris accumulated in the texture (dots), and environmental conditions (e.g., low temperature limiting hand function), without limitation. As a result, visually impaired people must often actuate a respective actuator (e.g., button or switch) to determine the function provided by the actuator, which may be unwanted.

There is a need for improved systems and methods for providing information about an object (e.g., an actuator or other type of object) to a person in a convenient and effective manner.

SUMMARY

Examples of the present disclosure provide systems for communicating information regarding an object (e.g., a button, other actuator, or other type of object) from a base unit located at, or otherwise associated with, the object to a mobile unit carried by a person seeking information about the object (e.g., a description of the object or how the object functions). The mobile unit may receive such information regarding the object (referred to herein as "object related data") from the base unit, and output the information (or information derived from such information) to the user via an output device, e.g., a speaker, display device, or haptic feedback generator.

The base unit may include a capacitive coupling element providing a base unit-human capacitive coupling between the base unit and the person, and the mobile unit may include a capacitive coupling element providing a mobile unit-human capacitive coupling between the mobile unit and the person. The base unit-human capacitive coupling and mobile unit-human capacitive coupling enable a data transmission connection (DTC) between the base unit and the mobile unit that passes through the person's body. The DTC may allow communication of information from the base unit to the mobile unit, e.g., using a low-frequency Amplitude Shift Key (ASK) communication protocol to transmit signals through the person's body.

The base unit may include a touch/proximity detection device to detect a "touch/proximity event" involving the person physically touching, or in proximity to, the object (or to a defined detection element associated with the object), and in response to detecting the touch/proximity event, to initiate a communication sequence to transmit object related data to the person for output via the mobile unit carried by the person. The communication sequence may include an authentication process (e.g., a challenge and response sequence) to authenticate the mobile unit before the base unit transmits the object related data.

Systems disclosed herein may allow a person to obtain information about an object in a fast, efficient manner. For example, a system as disclosed herein may allow a person to obtain information about an actuator (e.g., a button, switch, or other actuator) before actuating the actuator. For example, for an object comprising a depressible button, a person may lightly touch or come into proximity with the button to trigger a touch/proximity event detection, which in turn causes the base unit to initiate a communication sequence to transmit object related data (e.g., describing the function associated with the button) to the person for output via the mobile unit carried by the person. Thus, the person may learn the function of the button, e.g., to determine whether to press the button. In some examples, systems disclosed herein may be useful for vision impaired persons, e.g., allowing such persons to quickly and efficiently obtain audio data describing various objects.

One aspect provides a system including a base unit associated with an object, and a mobile unit. The base unit includes a base unit capacitive coupling element to provide a base unit-human capacitive coupling between the base unit and a person, a base unit processor, and base unit transmitter circuitry. The mobile unit includes a mobile unit capacitive coupling element to provide a mobile unit-human capacitive coupling between the mobile unit and the person, a mobile unit processor, and mobile unit receiver circuitry. The base unit-human capacitive coupling and the mobile unit-human capacitive coupling enable a data transmission connection between the base unit and the mobile unit and passing through the person's body. The base unit processor may cause the base unit transmitter circuitry to transmit object related data via the data transmission connection passing through the person's body, the object related data comprising information associated with the object. The mobile unit receiver circuitry may receive the object related data via the data transmission connection, and the mobile unit processor may cause an output device to output human-perceptible signals based on the received object related data.

In some examples, the base unit includes a touch/proximity detection device to detect a touch/proximity event by the person, and the base unit processor may initiate a communication sequence in response to the touch/proximity detection device detecting the touch/proximity event, the communication sequence including the transmission of the object related data by the base unit transmitter circuitry.

In some examples, the object comprises a human-selectable actuator, the touch/proximity detection device is provided at the human-selectable actuator, and the object related data identifies an actuator function associated with the human-selectable actuator.

In some examples, the touch/proximity event does not actuate the human-selectable actuator.

In some examples, the touch/proximity detection device and the base unit capacitive coupling element are provided at the human-selectable actuator.

In some examples, the output device comprises a speaker, and the human-perceptible signals comprise audible signals output by the speaker based on the received object related data.

In some examples, the mobile unit comprises an earbud or headphones including the speaker.

In some examples, the mobile unit includes mobile unit transmission circuitry to transmit mobile unit data via the data transmission connection passing through the person's body, the mobile unit data comprising information associated with the mobile unit or the person, and the base unit includes base unit receiver circuitry to receive the mobile unit data via the data transmission connection.

In some examples, the object related data comprises an audio file (e.g., an audio sample).

In some examples, the mobile unit includes a memory storing multiple substantive object related data, the object related data transmitted by the base unit and received by the mobile unit comprises an object related identifier, and the mobile unit processor to identify, from the multiple substantive object related data, respective substantive object related data corresponding with the object related identifier, and cause the output device to output the identified substantive object related data as human-perceptible signals.

In some examples, the mobile unit includes a memory storing multiple audio files, the object related data comprises an audio file identifier, and the mobile unit processor may receive the audio file identifier via the data transmission connection, identify a corresponding audio file of the multiple audio files, and cause the output device to output the identified audio file as the human-perceptible signals.

One aspect provides a system including a base unit. The base unit includes a capacitive coupling element located at or proximate an object, a touch/proximity detection device including (a) a detection element located at or proximate the object, and touch/proximity detection circuitry to detect a touch/proximity event at the detection element, the touch/proximity event comprising a person physically touching or proximate the detection element, and a processor to initiate a communication sequence with a mobile unit in response to the detection of the touch/proximity event by the touch/proximity detection device, the communication sequence including a transmission of object related data to the mobile unit via a data transmission connection including a capacitive coupling between the capacitive coupling element and the person.

In some examples, the object comprises a human-selectable actuator, the object related data identifies an actuator function associated with the human-selectable actuator, and wherein the touch/proximity event does not actuate the human-selectable actuator.

In some examples, the mobile unit comprises an output device to output human-perceptible signals based on the object related data received from the base unit via the data transmission connection. In some examples, the output device comprises a speaker to output audio signals.

One aspect provides a method including detecting, by a touch/proximity detection device of a base unit associated with an object, a touch/proximity event involving a person. The method further includes the base unit initiating a communication sequence in response to detecting the touch/proximity event, including transmitting object related data from the base unit to a mobile unit via a data transmission connection between the base unit and the mobile unit, wherein the data transmission connection includes (a) a base unit-human capacitive coupling between the base unit and the person and (b) a mobile unit-human capacitive coupling between the mobile unit and the person, and wherein the data transmission connection passes through the person's body. The method further includes the mobile unit receiving the object related data transmitted via the data transmission connection, and the mobile unit causing an output device to output human-perceptible signals based on the received object related data.

In some examples, the object comprises a human-selectable actuator, the touch/proximity detection device is provided in the human-selectable actuator, and the object related data identifies an actuator function associated with the human-selectable actuator.

In some examples, the touch/proximity event does not actuate the human-selectable actuator.

In some examples, the mobile unit causing an output device to output human-perceptible signals based on the received object related data comprises the mobile unit causing a speaker to output audible signals based on the received object related data.

In some examples, the method includes the mobile unit transmitting mobile unit data via the data transmission connection passing through the person's body, the mobile unit data comprising information associated with the mobile unit or the person, and the base unit receiving the mobile unit data via the data transmission connection.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
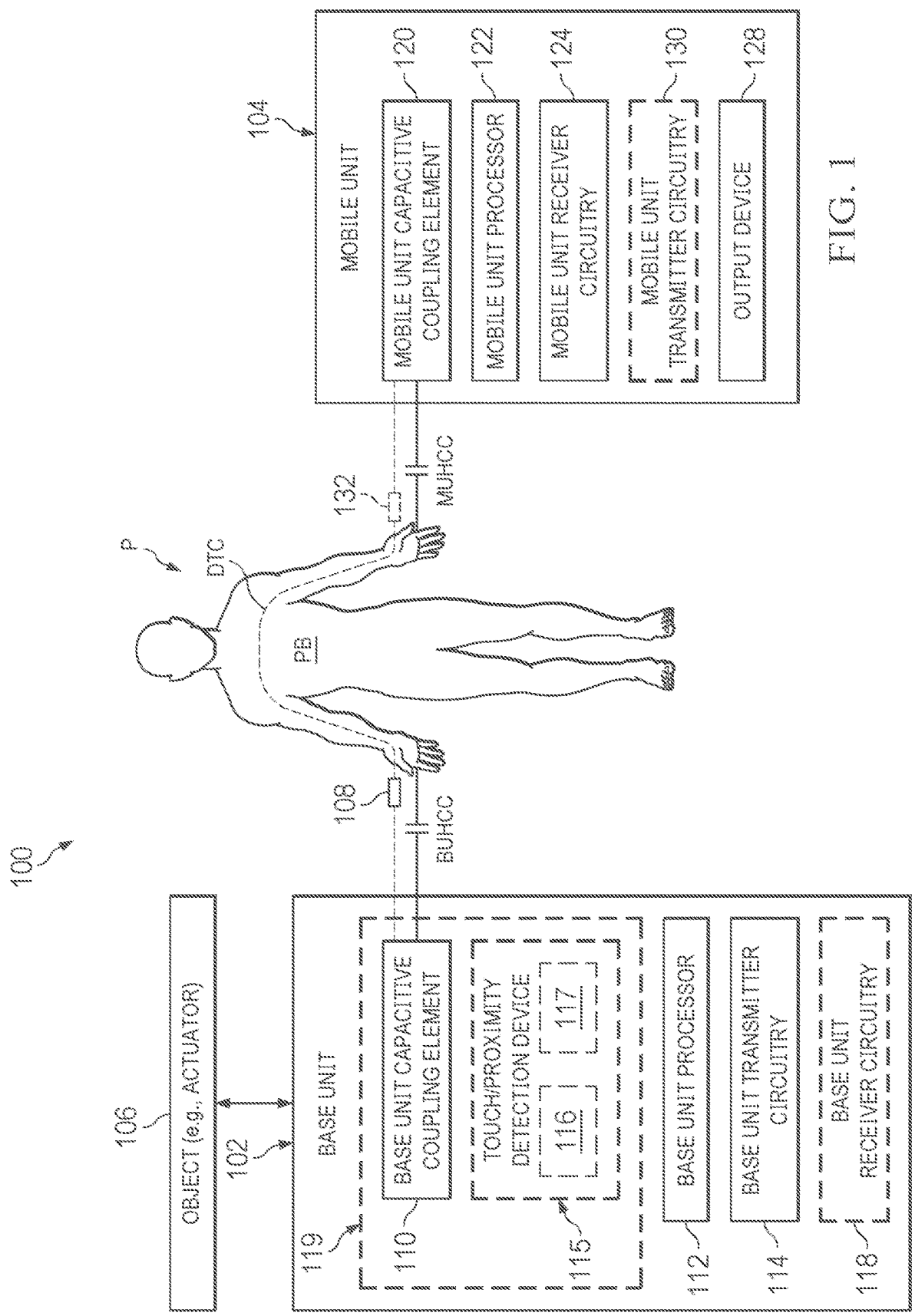
FIG. 1 is a schematic of an example system for providing object related data from a base unit associated with an object to a mobile unit via a data transmission connection passing through a person's body.

FIG. 1 is a schematic of an example system 100 for providing information regarding an object 106 to a person P. The example system 100 includes a base unit 102 located at, or otherwise associated with, the object 106, and a mobile unit 104 carried by the person P. The object 106 may include a human-selectable actuator (e.g., a switch, button, knob, slider, lever, or other device that may be actuated by a human) or any other physical object. As illustrative examples only, the object 106 may be an actuator or other element of an elevators, an intercom, a pedestrian semaphore, an ATM, a ticket machine, a public transportation system, or household electronics (e.g., a washing machine, dishwasher, stove, or microwave), without limitation.

The base unit 102 may include a base unit capacitive coupling element 110, a base unit processor 112, and a base unit transmitter circuitry 114. The base unit capacitive coupling element 110 may comprise a conductive pad or other element to provide a capacitive coupling between the base unit 102 and the person P, e.g., when the person P comes into physical contact or proximity of base unit capacitive coupling element 110. Such capacitive coupling is referred to herein as a "base unit-human capacitive coupling," indicated as BUHCC. The base unit capacitive coupling element 110 may also be referred to as an antenna. As shown in FIG. 1, the base unit-human capacitive coupling BUHCC defines one component of a data transmission connection DTC between the base unit 102 and mobile unit 104 and passing through the person's body PB. (The data transmission connection DTC also includes a capacitive coupling between the mobile unit 104 and person P, referred to as a mobile unit-human capacitive coupling MUHCC, as discussed below.)

The base unit transmitter circuitry 114 may include circuitry for transmitting object related data 108 from the base unit 102 to the mobile unit 104 via the data transmission connection DTC. For example, the base unit transmitter circuitry 114 may include a transmitter and driver for transmitting data (e.g., object related data 108) using a low-frequency Amplitude Shift Key (ASK) format (e.g., at 125 kHz), which passes through the person's body PB via the data transmission connection DTC.

Object related data 108 may include or identify any information related to the object 108, and may comprise (a) substantive object related data or (b) an object related identifier linked to substantive object related data. Substantive object related data (one example form of object related data 108) may include, for example, information describing the object 108 or a function related the object 108 (e.g., in the case of an object 108 comprising an actuator, information describing a function provided by the actuator), and may be embodied in any form, for example text data, audio data (e.g., an audio file), an image file, or video data, without limitation. Alternatively, an object related identifier (another example form of object related data 108) may comprise an identifier linked to substantive object related data 108' (not shown) stored by or otherwise accessible by the mobile unit 104, as discussed below.

In some examples, object related data 108 stored by (or otherwise accessible to) base unit 102 may include multiple different types and/or formats of data. For example, base unit 102 may store object related data 108 for a respective object 106 in multiple different formats (e.g., an audio file, video file, and text file) usable by different mobile units 104 having different types of output devices 128 (e.g., speakers or display devices, without limitation). As another example, the base unit 102 may store object related data 108 for a respective object 106 in multiple different languages, e.g., to accommodate persons P with different language preferences.

In some examples, the base unit 102 may optionally include a touch/proximity detection device 115 including touch/proximity detection circuitry 116 to detect a "touch/proximity event" by the person P, the touch/proximity event comprising the person P touching or coming into proximity (e.g., a proximity allowing a capacitance-based detection of the person P) with a detection element 117 of the touch/proximity detection device 115. In response to the touch/proximity detection device 115 detecting the touch/proximity event, the base unit processor 112 may initiate a communication sequence to transmit the object related data 108 (using the base unit transmitter circuitry 114) via the data transmission connection DTC. The touch/proximity detection circuitry 116 may include capacitive touch detection circuitry.

In some examples, the detection element 117 may be integrated with or located adjacent or near the base unit capacitive coupling element 110 and/or the object 106, as indicated by dashed line 119, such that the touch/proximity detection device 115 may detect the person P touching or coming into proximity of the base unit capacitive coupling element 110.

The base unit processor 112 may comprise any suitable processor or processors to execute instructions stored in computer-readable media related to the operation of the base unit 102 (e.g., instructions embodied in software and/or firmware stored in memory provided in or otherwise accessible to the base unit 102). For example, the base unit processor 112 may execute respective instructions for performing various functions associated with (a) the base unit transmitter circuitry 114 (e.g., for transmitting object related data 108 via the base unit capacitive coupling element 110), (b) the optional touch/proximity detection device 115 (e.g., for detecting touch/proximity events and initiating a communication sequence or other actions in response thereto), and (c) optional base unit receiver circuitry 118 (e.g., for receiving and decoding optional mobile unit data 132 received from the mobile unit 104 and initiating respective actions in response thereto), without limitation. The base unit processor 112 may comprise at least one microprocessor, microcontroller, embedded processor, digital signal processor (DSP), or other type of computer processor(s).

The mobile unit 104 may include a mobile unit capacitive coupling element 120, a mobile unit processor 122, a mobile unit receiver circuitry 124, and an output device 128. In some examples, the mobile unit 104 may comprise a single device including the mobile unit capacitive coupling element 120, the mobile unit processor 122, the mobile unit receiver circuitry 124, and the output device 128. For example, the mobile unit 104 may comprise an earbud, headphones, a smartphone or other handheld device including the mobile unit capacitive coupling element 120, the mobile unit processor 122, the mobile unit receiver circuitry 124, and the output device 128.

In other examples, the mobile unit 104 may include two or more distinct devices communicatively connected to each other, wherein the respective components of the mobile unit 104—including the mobile unit capacitive coupling element 120, the mobile unit processor 122, the mobile unit receiver circuitry 124, and the output device 128—may be provided in different devices of the mobile unit 104. For example, the mobile unit 104 may include a smartphone and an earbud wirelessly connected to the smartphone, wherein the mobile unit capacitive coupling element 120, the mobile unit processor 122, the mobile unit receiver circuitry 124 are provided in the smartphone, and the output device 128 (in this example comprising a speaker) is provided in the earbud.

The mobile unit capacitive coupling element 120 may comprise a conductive pad or other element to provide a capacitive coupling between the mobile unit 104 and the person P, e.g., when the mobile unit 104 is carried by the person P. The capacitive coupling between the mobile unit 104 and person P is referred to as mobile unit-human capacitive coupling MUHCC, which forms a component of the data transmission connection DTC between the base unit 102 and mobile unit 104. Like the base unit capacitive coupling element 102, the mobile unit capacitive coupling element 120 may also be referred to as an antenna.

As used herein, the mobile unit 104 being carried by the person P means the mobile unit 104 is worn by, carried by, or otherwise located with the person P. For example, the person P may hold the mobile unit 104 in their hand, e.g., wherein the mobile unit 104 comprises a smartphone. As another example, the mobile unit 104 may be secured in contact with or proximate person's body PB, e.g., wherein the mobile unit 104 comprises an earbud, headphones, or a watch. As another example, the mobile unit 104 may be carried in an article of clothing or accessory worn by the person P.

The mobile unit receiver circuitry 124 may include circuitry connected to mobile unit capacitive coupling element 120 to receive object related data 108 received from the base unit 102 via the data transmission connection DTC. For example, the mobile unit receiver circuitry 124 may include a receiver and demodulator for receiving and demodulating data received via a low-frequency Amplitude Shift Key (ASK) format (e.g., at 125 kHz), e.g., as transmitted by the base unit 102.

The output device 128 may comprise any device to output human-perceptible signals, for example audible signals, visually displayed information, or haptic feedback, based on object related data 108 received via the data transmission connection DTC. For example, the output device 128 may comprise at least one speaker, e.g., provided in an earbud, headphones, or a smartphone, to output audio data to the person P, for example audio data describing the object 106. As another example, the output device 128 may comprise a display device, e.g., provided in a smartphone or other mobile device, e.g., to visual display data describing the object 106. As another example, the output device 128 may comprise a haptic feedback generator, e.g., to generate human-detectable vibrations.

The mobile unit processor 122 may comprise any suitable processor or processors to execute instructions stored in computer-readable media related to the operation of the mobile unit 104 (e.g., instructions embodied in software and/or firmware stored in memory provided in or otherwise accessible to the mobile unit 104). For example, the mobile unit processor 122 may execute respective instructions for performing various functions associated with (a) the mobile unit receiver circuitry 124 (e.g., for receiving and decoding object related data 108 received from the base unit 102 via the mobile unit capacitive coupling element 120, and causing an output of human-perceptible signals via the output device 128 related to the object related data 108), and (b) optional mobile unit transmitter circuitry 130 (e.g., for transmitting optional mobile unit data 132 via the mobile unit capacitive coupling element 120), without limitation. The mobile unit processor 122 may comprise at least one microprocessor, microcontroller, embedded processor, digital signal processor (DSP), or other type of computer processor(s).

In some examples, the mobile unit processor 122 processes object related data 108 received from the base unit 102 by the mobile unit receiver circuitry 124, and causes the output device 128 to output human-perceptible signals based on the received object related data 108. In examples in which the object related data 108 comprises substantive object related data (discussed above), e.g., in the form of a text file, audio file, image file, or video file, the mobile unit processor 122 may processes the substantive object related data and cause the output device 128 to output the substantive object related data in any suitable form. For example, where the output device 128 comprises a speaker, the mobile unit processor 122 may cause the output device 128 to output audio sound, e.g., by playing the contents of an audio file (audio sample), or by converting a text file to audio (e.g., using a text-to-speech tool) and outputting the converted audio. As another example, where the output device 128 comprises a screen or other display device, the mobile unit processor 122 may cause the output device 128 to visually display the contents of a text file, image file, or video file. As another example, where the output device 128 comprises a haptic feedback generator, the mobile unit processor 122 may cause the output device 128 to generating vibrations or other haptic feedback, e.g., according to a haptic feedback protocol (e.g., defined in the received object related data 108 or stored by or otherwise accessible to the mobile unit 104) specifying respective haptic feedback associated with respective substantive object related data.

In examples in which the object related data 108 comprises an object related identifier (as discussed above), the mobile unit processor 122 may process the object related identifier to identify corresponding substantive object related data 108' (not shown) linked to the object related identifier, access the substantive object related data 108' (stored by or otherwise accessible to the mobile unit 104), and cause the output device 128 to output the substantive object related data 108', e.g., in any of the manners discussed above (e.g., by outputting audio sound, visually displaying information, or by generating vibrations or other haptic feedback corresponding with the substantive object related data 108').

In some examples, the example system 100 optionally includes respective components to communicate mobile unit data 132 from the mobile unit 104 to the base unit 102 via the data transmission connection DTC passing through the person's body PB, in the opposite direction as the communication of object related data 108 from the base unit 102 to the mobile unit 104 via the data transmission connection DTC. In such examples, the mobile unit 104 may include optional mobile unit transmission circuitry 130 connected to the mobile unit capacitive coupling element 120 to transmit mobile unit data 132 via the data transmission connection DTC, and the base unit 102 may include optional base unit receiver circuitry 118 connected to the base unit capacitive coupling element 110 to receive the mobile unit data 132 transmitted via the data transmission connection DTC.

Mobile unit data 132 may include any information associated with the mobile unit 104 or the person P. For example, mobile unit data 132 may include authentication data to authenticate the mobile unit 104 or person P with the base unit 102, e.g., as a prerequisite for the base unit 102 to transmit the object related data 108 to the mobile unit 104.

As another example, mobile unit data 132 may indicate a requested format of object related data 108, depending on the type of output device 128 provided at the mobile unit 104 (e.g., a speaker, display device, or haptic feedback generator), which information may be used by the base unit 102 to select a respective format (e.g., file type) of object related data 108 to deliver to the mobile unit 104, e.g., in an example in which the base unit 102 has access to multiple formats (e.g., file types) of object related data 108. For example, the mobile unit data 132 may include a request for object related data 108 in the form of an audio file, and accordingly the base unit 102 may access and transmit an audio file (as object related data 108) to the mobile unit 104.

As another example, mobile unit data 132 may indicate a requested language of the object related data 108 (e.g., English, Spanish, Chinese, or other language understandable to the person P), and accordingly the base unit 102 may select object related data 108 in the requested language (e.g., from a set of object related data 108 stored in different languages) and transmit the selected object related data 108 to the mobile unit 104.

It should be understood that mobile unit data 132 may include any other type of information associated with the mobile unit 104 or the person P, which may be usable by the base unit 102 for selecting respective object related data 108, the format of the object related data 108, or any other aspect of the object related data 108 for delivery to the mobile unit 104.

In some examples, respective components of the system 100 may utilize BodyCom™ technology by Microchip Technology Inc. of Chandler, Arizona, for example as disclosed in U.S. Patent Application Publication 2015/0044969 published Feb. 12, 2015 ("the '969 Publication"), the entire contents of which are hereby incorporate by reference. For example, base unit 102 disclosed herein may include any disclosed components (e.g., any hardware, software, circuitry, or other components) of example base units 102, 402, 504, and/or 604 disclosed in the '969 Publication, and mobile unit 104 disclosed herein may include any disclosed components (e.g., any hardware, software, circuitry, or other components) of example mobile units 108, 408, 508, and/or 662/664 disclosed in the '969 Publication.

In an example in which the system 100 includes the optional touch/proximity detection device 115, the system 100 may generally operate in the following manner. The person P carrying the mobile unit 104 desires information about the object 106, e.g., an actuatable (e.g., depressible) button that triggers a defined function. The person P places their finger on, or proximate, the detection element 117 of the touch/proximity detection device 115 (i.e., a touch/proximity event), which detection element 117 may be integrated with or located adjacent or near the base unit capacitive coupling element 110 and/or the object 106, as discussed above. The touch/proximity detection circuitry 116 of the touch/proximity detection device 115 detects the touch/proximity event. In response, the base unit processor 112 initiates a communication sequence to transmit the object related data 108 (using the base unit transmitter circuitry 114) via the data transmission connection DTC, i.e., via the base unit-human capacitive coupling BUHCC, the person's body PB, and the mobile unit-human capacitive coupling MUHCC.

In some examples, the communication sequence may include an authentication process (e.g., a challenge and response sequence) between the base unit 102 and the mobile unit 104 (involving transmission, receipt, and processing of respective messages by both the base unit 102 and the mobile unit 104), and after successful authentication of the mobile unit 104, transmission of the object related data 108 by the base unit 102, i.e., using the base unit transmitter circuitry 114 to transmit the object related data 108 via the base unit capacitive coupling element 110. The authentication process (e.g., challenge and response sequence) may involve the transmission of mobile unit data 132 (including authentication information) by the optional mobile unit transmitter circuitry 130 (transmitted via the mobile unit capacitive coupling element 120 and the data transmission connection DTC), and receipt of such mobile unit data 132 (including authentication information) by the optional base unit receiver circuitry 118 (received via the base unit capacitive coupling element 110).

In other examples, the communication sequence triggered by the detected touch/proximity event may omit an authentication of the mobile unit 104, i.e., wherein the base unit 102 transmits the object related data 108 to the mobile unit 104 in response to the detected touch/proximity event, without authenticating the mobile unit 104.

The object related data 108 transmitted via the data transmission connection DTC (terminating at the mobile unit capacitive coupling element 120) may be received by the mobile unit receiver circuitry 124 (connected to the mobile unit capacitive coupling element 120), and processed by the mobile unit processor 122, which causes the output device 128 to output human-perceptible signals based on the received object related data 108, e.g., by outputting audio sound, displaying an image or video, or generating haptic feedback as discussed above.

In some examples, the system 100 may allow a vision impaired person P to obtain information regarding an object 106. For example, where the object 106 comprises a pressable button to perform a respective function, the system 100 may allow the person P to learn the function associated with the button by touching or coming into proximity with, but not actuating, the button, thereby allowing the person P to determine whether to actuate (press) the button.

Figure 2:
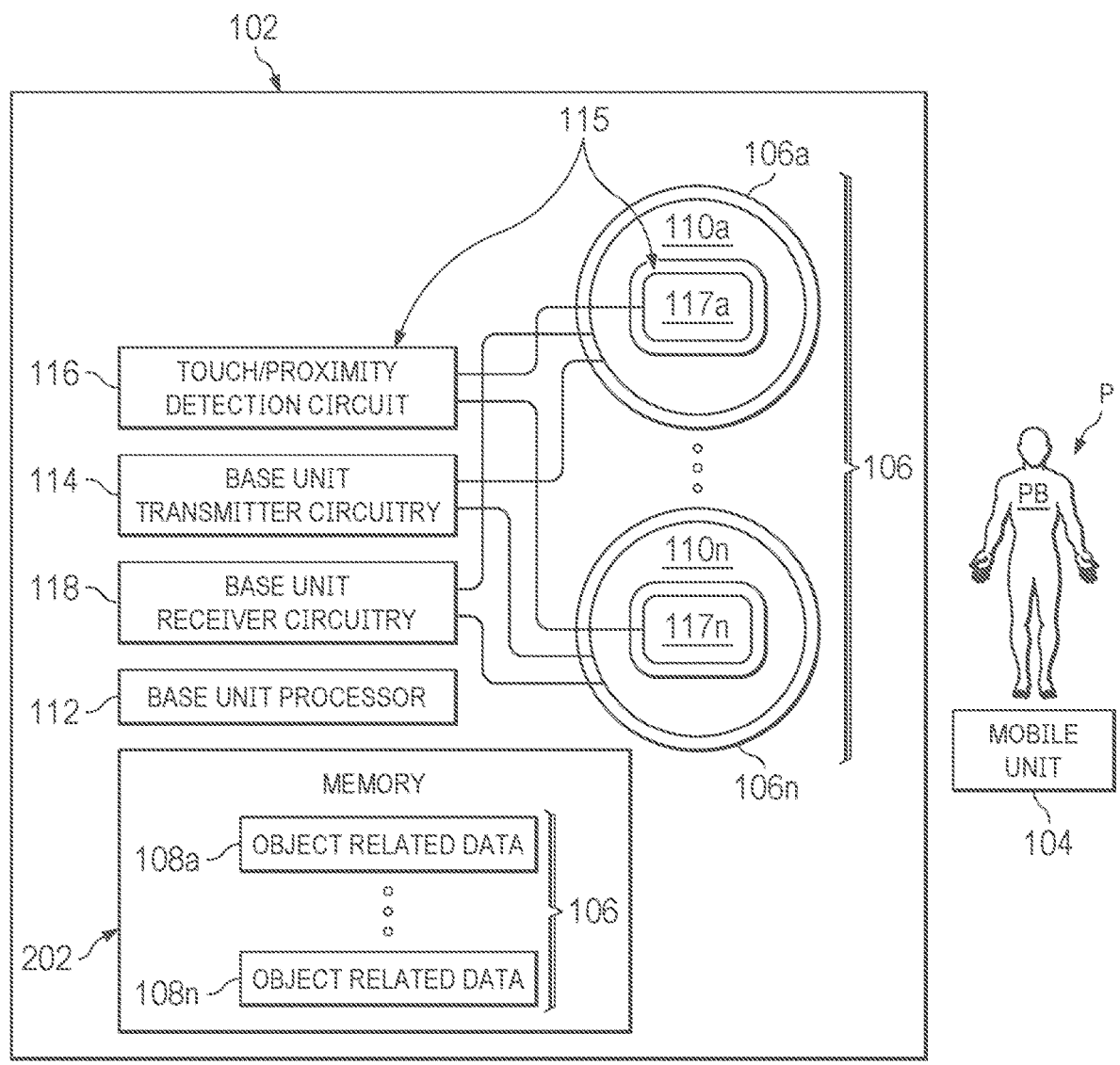
FIG. 2 is a schematic of an example base unit for use in the example system shown in FIG. 1, according to one example.

FIG. 2 is a schematic of an example base unit 102 for use in the example system 100 shown in FIG. 1, according to one example. As shown, the example base unit 102 may include multiple objects 106 (indicated at 106a-106n) and respective components for transmitting respective object related data 108 (indicated at 108a-108n) to a mobile unit 104 carried by a person P (shown in FIG. 1). In this example, the multiple objects 106a-106n comprise actuatable (e.g., depressible) buttons that trigger respective functions. Accordingly, the following description refers to buttons 106a-106n.

The example base unit 102 includes a touch/proximity detection device 115 including touch/proximity detection circuitry 116 connected to respective detection elements 117a-117n provided at respective buttons 106a-106n to detect a touch/proximity event at respective buttons 106a-106n.

The example base unit 102 also includes a respective base unit capacitive coupling element 110a-110n provided at respective buttons 106a-106n to allow a respective data transmission connection DTC (not shown) between respective buttons 106a-106n (via the respective base unit capacitive coupling elements 110a-110n) and the mobile unit 104 carried by the person P.

Thus, as shown in FIG. 2, respective buttons 106a-106n may have both a respective detection element 117a-117n and a respective base unit capacitive coupling element 110a-110n integrated with or otherwise provided on or at the respective button 106a-106n. In some examples, for a respective button 106a-106n, the respective detection element 117a-117n and the respective base unit capacitive coupling element 110a-110n may comprise distinct conductive elements physically separate from each other, which may reduce or avoid signal interference or other unwanted effects during a transmission of respective object related data 108a-108n (via a respective base unit capacitive coupling element 110a-110n) while the person P is physically touching the respective detection element 117a-117n.

The example base unit 102 also includes the base unit processor 112, base unit transmitter circuitry 114, base unit receiver circuitry 118, and memory 202 storing object related data 108a-108n.

The base unit transmitter circuitry 114 includes circuitry for transmitting respective object related data 108a-108n via respective base unit capacitive coupling elements 110a-110n provided at respective buttons 106a-106n, e.g., in response to touch/proximity events detected (by the touch/proximity detection device 115) at respective buttons 106a-106n. For example, in response to a touch/proximity event detected at button 106a (e.g., the touch/proximity detection device 115 detecting a touch/proximity event via the detection element 117a at button 106a), the base unit processor 112 may access object related data 108a (e.g., describing the functionality associated with button 106a) and control base unit transmitter circuitry 114 to transmit the object related data 108a retrieved from memory 202 via the base unit capacitive coupling element 110a at button 106a.

The base unit receiver circuitry 118 is connected to the respective base unit capacitive coupling elements 110a-110n to receive mobile unit data 132 transmitted via the data transmission connection DTC and received at a base unit capacitive coupling elements 110a-110n at a respective button 110a-110n at which a touch/proximity event is detected at a respective detection element 117a-117n. In some examples, the base unit receiver circuitry 118 may include a receiver and demodulator for receiving and demodulating data received via a low-frequency Amplitude Shift Key (ASK) format (e.g., at 125 kHz), e.g., as transmitted by the mobile unit 104.

The base unit processor 112 may execute instructions (e.g., embodied in software and/or firmware) for performing various functions associated with (a) the base unit transmitter circuitry 114 (e.g., for transmitting respective object related data 108a-108n via respective base unit capacitive coupling elements 110a-110n at respective buttons 106a-106n), (b) the touch/proximity detection device 115 (e.g., for detecting touch/proximity events at respective detection elements 117a-117n at respective buttons 106a-106n, and initiating a communication sequence or other respective actions in response thereto), and (c) base unit receiver circuitry 118 (e.g., for receiving and decoding optional mobile unit data 132 received (from the mobile unit 104) via respective base unit capacitive coupling elements 110a-110n at respective buttons 106a-106n, and initiating respective actions in response thereto), without limitation.

Memory 202 may include ROM (read only memory), EPROM (erasable programmable ROM) and EEPROM (electrically erasable programmable ROM), ferroelectric RAM, Flash memory, disk storage, or any other type of memory to store object related data 108a-108n corresponding with respective buttons 106a-106n.

Figure 3:
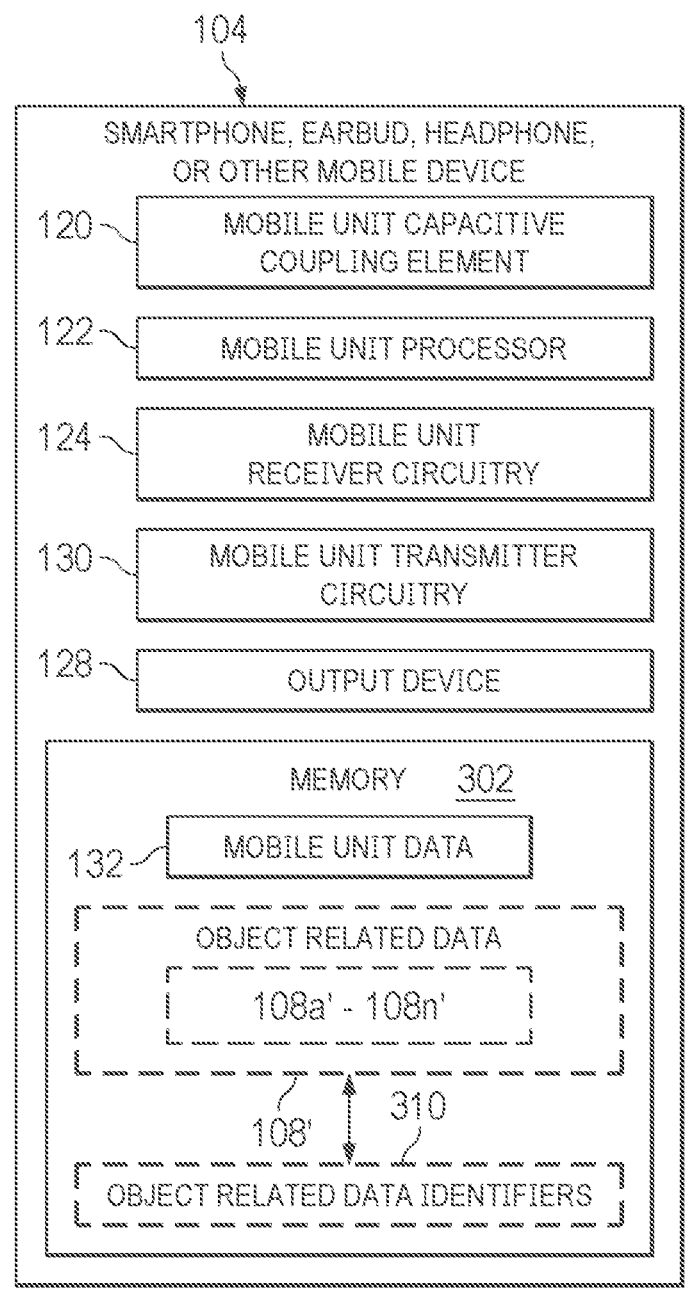
FIG. 3 is a schematic of an example mobile unit for use in the example system shown in FIG. 1, according to one example.

FIG. 3 is a schematic of an example mobile unit 104 to be carried by a person P for use in the example system 100 shown in FIG. 1, according to one example. As shown, the example mobile unit 104 may include the mobile unit capacitive coupling element 120, mobile unit processor 122, mobile unit receiver circuitry 124, output device 128, mobile unit transmitter circuitry 130, and memory 302. In some examples, the mobile unit 104 may be capable to communicate with multiple different base units 102, e.g., wherein respective ones of the multiple different base units 102 may be associated with one or multiple different objects 106.

As discussed above, the mobile unit capacitive coupling element 120 may comprise a conductive pad or other conductive element to provide a mobile unit-human capacitive coupling MUHCC between the mobile unit 104 and the person P.

The mobile unit receiver circuitry 124 may include circuitry connected to mobile unit capacitive coupling element 120 to receive object related data 108 received from the base unit 102 via the data transmission connection DTC. For example, the mobile unit receiver circuitry 124 may receive respective object related data 108a-108n from the example base unit 102 shown in FIG. 2 in response to a touch/proximity event by the person P at a respective button 106a-106n.

As discussed above, the output device 128 may comprise any device to output human-perceptible signals based on output object related data 108 received from a respective base unit 102. For example, the output device 128 may output object related data 108 in the form of substantive object related data received from a respective base unit 102. As another example, the output device 128 may output substantive object related data 108' corresponding with object related data 108 in the form of an object related identifier received from a respective base unit 102, e.g., as discussed below regarding memory 302. In some examples, the output device 128 may comprise at least one speaker, display device, or haptic feedback generator, as discussed herein.

The mobile unit transmitter circuitry 130 may include circuitry for transmitting mobile related data 132 from the mobile unit 104 to respective base unit(s) 102 via the data transmission connection DTC (i.e., via the mobile unit capacitive coupling element 120). For example, the mobile unit transmitter circuitry 130 may include a transmitter and driver for transmitting data (e.g., mobile related data 132 and/or authentication related messages) using a low-frequency Amplitude Shift Key (ASK) format (e.g., at 125 kHz)

Memory 302 may store mobile unit data 132, and may optionally store substantive object related data 108' and object related data identifiers 310. Memory 302 may include ROM (read only memory), EPROM (erasable programmable ROM) and EEPROM (electrically erasable programmable ROM), ferroelectric RAM, Flash memory, disk storage, or any other type of memory to store mobile unit data 132, substantive object related data 108', and/or object related data identifiers 310.

As discussed above, mobile unit data 132 may include any information associated with the mobile unit 104 or the person P, for example including authentication data (for authenticating the mobile unit 104 with respective base unit(s) 102), information indicate a requested format of object related data 108 corresponding with the type of output device 128 provided at the mobile unit 104 (e.g., a speaker, display device, or haptic feedback generator), or information indicating a requested language of object related data 108 to acquire from respective base unit(s) 102.

As discussed above, in some examples the object related data 108 transmitted by the base unit 102 and received by the mobile unit 104 may comprise an object related identifier (as opposed to substantive object related data) linked to corresponding substantive object related data 108' stored by the mobile unit 104, e.g., to reduce data storage requirements at the base unit 102. In such examples, as shown in FIG. 3, memory 302 of the mobile unit 104 may store (a) various substantive object related data 108' and (b) a set of object related data identifiers 310 linking object related identifiers (that may be received from respective base units 102) to corresponding substantive object related data 108'. For example, referring to the example base unit 102 shown in FIG. 2, memory 302 may store multiple substantive object related data 108a'-108n' corresponding with respective buttons 106a-106n. In operation, when the base unit 102 detects a touch/proximity event at button 106a, the base unit 102 may transmit object related data 108a (in some examples after a successful authentication of the mobile unit 104) in the form of an object related identifier corresponding with button 106a, and the mobile unit 104 may use object related data identifiers 310 to identify, from the multiple substantive object related data 108a'-108n', substantive object related data 108a' corresponding with the received object related identifier (e.g., data identifying the function associated with button 106a) and output of the identified substantive object related data 108a' via the output device 128. The substantive object related data 108a' may be in a language understood by person P, thereby allowing object related data 108a to be language independent.

As discussed above, the mobile unit processor 122 may execute instructions (e.g., embodied in software and/or firmware) for performing various functions associated with the mobile unit 104, e.g., including instructions for performing various functions associated with (a) the mobile unit receiver circuitry 124 (e.g., for receiving and decoding object related data 108 received from the base unit 102 via the mobile unit capacitive coupling element 120, and outputting corresponding human-perceptible signals via the output device 128), (b) the mobile unit transmitter circuitry 130 (e.g., for transmitting mobile unit data 132 to the base unit 102), and (c) identifying substantive object related data 108 corresponding with object related data 108 received from the base unit 102 in the form of an object related identifier, as discussed above), without limitation. The mobile unit processor 122 may execute instructions (e.g., embodied in software and/or firmware) for performing various functions associated with the memory 302.

In some examples, the mobile unit 104 may comprise a single device, e.g., a smartphone, an earbud, a headphone, or other mobile device, including the example components shown in FIG. 3.

Figure 4:
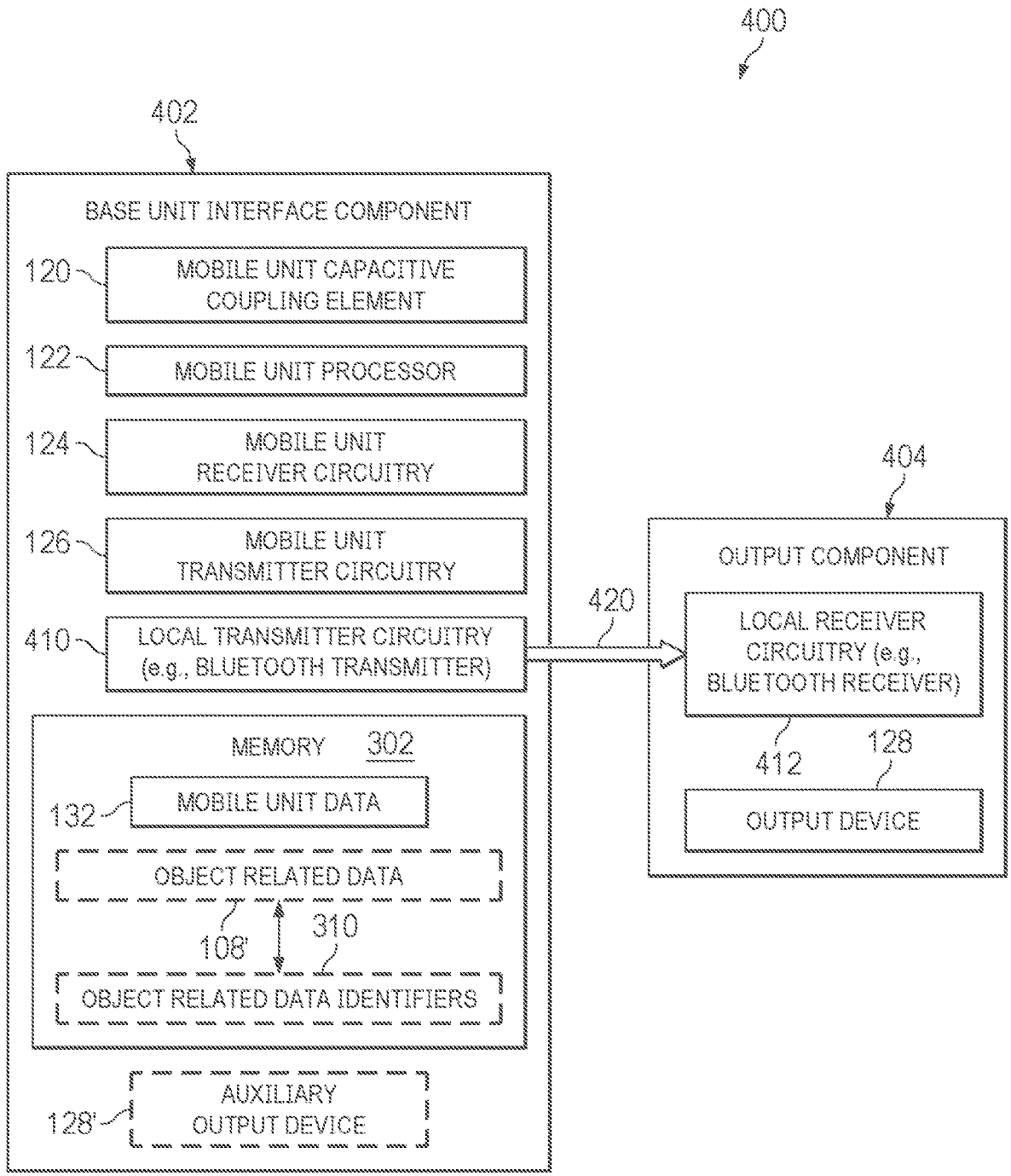
FIG. 4 is a schematic of an example multi-component mobile unit for use in the example system shown in FIG. 1, according to one example.

In other examples, the mobile unit 104 may include two or more devices wherein the example components shown in FIG. 3 are distributed between the two or more devices, to collectively provide the functionality of the mobile unit 104. For example, e.g., as shown in FIG. 4 discussed below, the mobile unit 104 may include (a) a smartphone or other handheld or wearable device including the capacitive coupling element 120, mobile unit processor 122, mobile unit receiver circuitry 124, mobile unit transmitter circuitry 130, and memory 302, communicatively coupled (e.g., by a wired or wireless connection) with (b) a separate output device 128, e.g., comprising an earbud, headphone, or display device. As another example, the mobile unit 104 may include (a) a handheld or wearable device including the capacitive coupling element 120 and a first processor, communicatively coupled (e.g., by a wired or wireless connection) with (b) a smartphone, earbud, or headphones including the mobile unit receiver circuitry 124, mobile unit transmitter circuitry 130, output device 128, and memory 302, and a second processor, wherein the first and second processors collectively perform the functions of the mobile unit processor 122 discussed herein.

FIG. 4 is a schematic of an example multi-component mobile unit 400 to be carried by a person P for use in the example system 100 shown in FIG. 1, according to one example. The example multi-component mobile unit 400 represents one example of the mobile unit 104 shown in FIGS. 1 and 3. The multi-component mobile unit 400 includes an example base unit interface component 402 and an example output component 404 communicatively connected to each other.

The example base unit interface component 402 may include the mobile unit capacitive coupling element 120, mobile unit processor 122, mobile unit receiver circuitry 124, mobile unit transmitter circuitry 130, local transmitter circuitry 410, and memory 302 (storing mobile unit data 132 and optionally substantive object related data 108' and object related data identifiers 310, e.g., as discussed above regarding FIG. 3). In some examples, the example base unit interface component 402 may comprise a smartphone or other handheld or wearable device.

The example output component 404 includes an output device 128 and local receiver circuitry 412. In some examples, the example output component 404 may comprise an earbud, headphones, or other handheld or wearable device, wherein the output device 128 may comprise a speaker, display device, or haptic feedback generator.

The local transmitter circuitry 410 and local receiver circuitry 412 may comprise circuitry for transmitting (via wired or wireless connection) object related output signals 420 from the base unit interface component 402 to the output component 404 for output by the output device 128. The object related output signals 420 may comprise object related data 108 received from a respective base unit 102 (via the base unit interface component 402), substantive object related data 108' accessed from memory 302, or other signals otherwise generated from object related data 108 by the mobile unit processor 122 for output by the output device 128. For example, local transmitter circuitry 410 and local receiver circuitry 412 may comprise respective transmitter and receiver circuitry for wireless communication using Bluetooth, Bluetooth BLE, ZigBee, WiFi, or other short-range wireless communication protocol.

In some examples, in addition to the output device 128 provided in the output component 404, the base unit interface component 402 may optionally include an auxiliary output device 128' to output the same or additional object related output signals 420. For example, some object related data 108 may include information for multiple different output formats, e.g., audio, displayable text, or displayable video, without limitation. The multiple different output formats may be included in object related data 108 received from the base unit 102, or the base unit interface component 402 may be capable to derive additional format(s) of object related data 108 received from the base unit 102 (e.g., the base unit interface component 402 may derive visual text data from object related data 108 received as audio data (e.g., using a speech-to-text tool), or retrieve additional format(s) as part of substantive object related data 108' response to object related data 108 from memory 302. Accordingly, the multi-component mobile unit 400 may be capable to (simultaneously or otherwise) output both (a) a first format of respective object related data 108 via the output device 128 of the output component 404 (e.g., audio output by a speaker) and (b) a second format of the respective object related data 108 via the auxiliary output device 128' of the base unit interface component 402 (e.g., a text display corresponding with the audio output).

Figure 5:
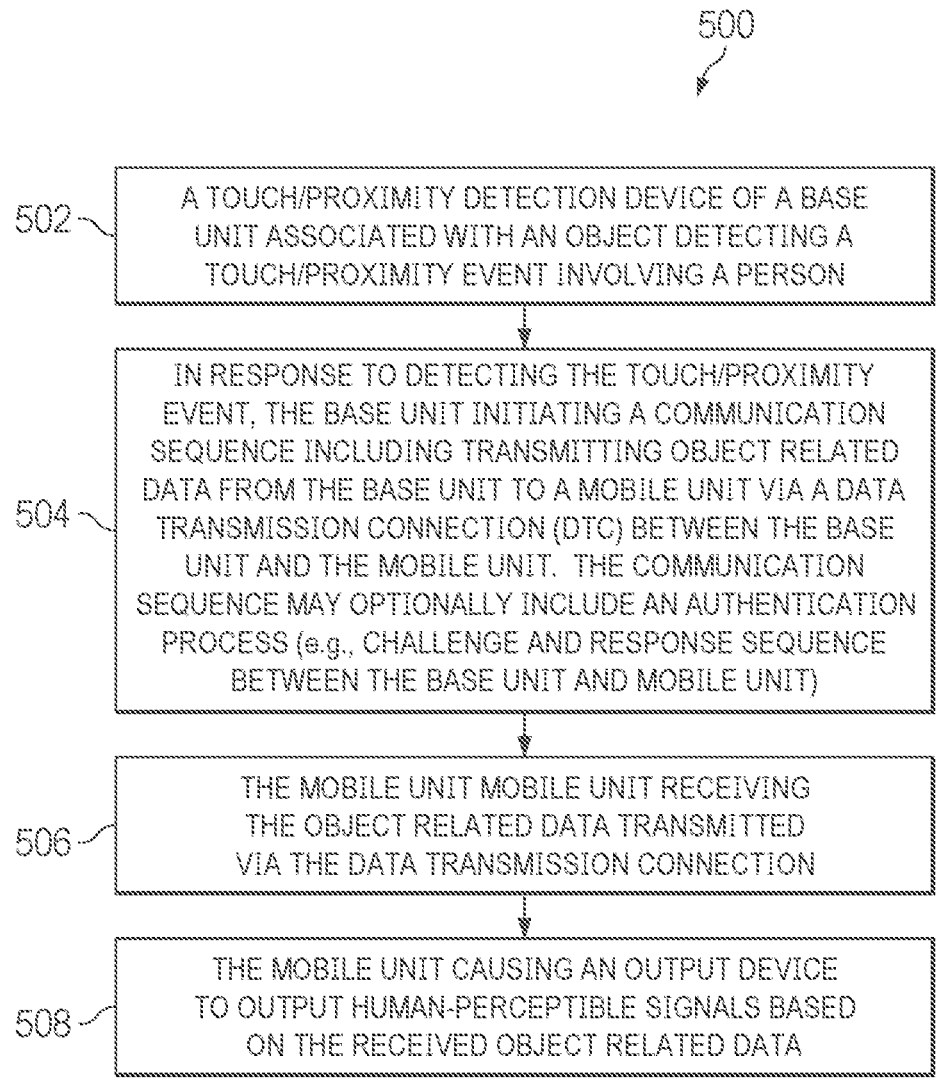
FIG. 5 is a flowchart of an example method for providing object related data from a base unit associated with an object to a mobile unit via a data transmission connection passing through a person's body.

FIG. 5 is a flowchart of an example method 500 for providing object related data 108 from a base unit associated with an object to a mobile unit via a data transmission connection passing through the body of a person carrying the mobile unit. At 502, a touch/proximity detection device of a base unit associated with an object (e.g., a button, switch, other actuator, or other type of object) detects a touch/proximity event involving a person. For example, the touch/proximity detection device may include touch/proximity detection circuitry (e.g., capacitive touch detection circuitry) to detect the person in physical contact with or in proximity with a detection element of the touch/proximity detection device, which detection element may be provided at the object.

At 504, in response to detecting the touch/proximity event, the base unit initiates a communication sequence to transmit object related data from the base unit to the mobile unit carried by the person via a data transmission connection between the base unit and the mobile unit. The data transmission connection includes (a) a base unit-human capacitive coupling between the base unit and the person (e.g., between a base unit capacitive coupling element and the person) and (b) a mobile unit-human capacitive coupling between the mobile unit and the person (e.g., between a mobile unit capacitive coupling element and the person), and passes through the person's body. In some examples, the object comprises a human-selectable actuator (e.g., a button or switch), and the object related data identifies a function associated with the human-selectable actuator.

In some examples, the communication sequence involves a two-way authentication sequence between the base unit and mobile unit (e.g., including the mobile unit communicating requested authentication information to the base unit, and the base unit confirming (or denying) the received authentication information), prior to the base unit transmitting the object related data (in the event of a successful authentication of the mobile device). In other examples, the authentication sequence may be omitted.

In some examples, the base unit and mobile unit may transmit respective information (e.g., object related data, authentication related messages, and/or other information) using a low-frequency Amplitude Shift Key (ASK) format, which passes through the person's body PB via the data transmission connection DTC.

At 506, the mobile unit receives the object related data transmitted via the data transmission connection DTC, and processes the received object related data. At 508, the base unit outputs human-perceptible signals (e.g., audio, images, video, or haptic feedback) human-perceptible signals representing the object related data via an output device (e.g., speaker, display device, or haptic feedback generator). In some examples, the object related data comprises audio data, and the mobile unit outputs the received audio data (or audio data derived therefrom) via a speaker.

In some examples, the object related data transmitted by the base unit comprises substantive object related data, wherein the mobile unit may output such substantive object related data (received from the base unit) via the output device. In other examples, the object related data transmitted by the base unit comprises an object related identifier, wherein the mobile unit may identify and access (e.g., from memory of the mobile unit) substantive object related data linked to the object related identifier, and output the accessed substantive object related data via the output.

Although example embodiments have been described above, other variations and embodiments may be made from this disclosure without departing from the spirit and scope of these embodiments.

The invention claimed is:
1. A system, comprising:
a base unit associated with a human-selectable actuator, the base unit including:
 a base unit capacitive coupling element to provide a base unit-human capacitive coupling between the base unit and a person;
 a touch/proximity detection device provided at or proximate the human-selectable actuator to detect touch/proximity events by the person, including a respective touch/proximity event by the person that does not actuate the human-selectable actuator;
 a base unit processor; and
 base unit transmitter circuitry;
a mobile unit including a mobile unit capacitive coupling element to provide a mobile unit-human capacitive coupling between the mobile unit and the person, a mobile unit processor, and mobile unit receiver circuitry;
wherein the base unit-human capacitive coupling and the mobile unit-human capacitive coupling enable a data transmission connection between the base unit and the mobile unit and passing through the person's body;
the base unit processor to, in response to the touch/proximity detection device detecting the respective touch/proximity event that does not actuate the human-selectable actuator, cause the base unit transmitter circuitry to transmit actuator related data via the data transmission connection passing through the person's body, the actuator related data comprising information identifying an actuator function associated with the human-selectable actuator;
the mobile unit receiver circuitry to receive the actuator related data via the data transmission connection; and
the mobile unit processor to cause an output device to output human-perceptible signals based on the received actuator related data.

2. The system of claim 1, wherein the touch/proximity detection device and the base unit capacitive coupling element are provided at the human-selectable actuator.

3. The system of claim 1, wherein the output device comprises a speaker, and wherein the human-perceptible signals comprise audible signals output by the speaker based on the received actuator related data.

4. The system of claim 3, wherein the mobile unit comprises an earbud or headphones including the speaker.

5. The system of claim 1, wherein:
the mobile unit includes mobile unit transmission circuitry to transmit mobile unit data via the data transmission connection passing through the person's body, the mobile unit data comprising information associated with the mobile unit or the person; and
the base unit includes base unit receiver circuitry to receive the mobile unit data via the data transmission connection.

6. The system of claim 1, wherein the actuator related data comprises an audio file.

7. The system of claim 1, wherein:
the mobile unit includes a memory storing multiple substantive actuator related data;
the actuator related data transmitted by the base unit and received by the mobile unit comprises an actuator identifier; and
the mobile unit processor to identify, from the multiple substantive actuator related data, respective substantive actuator related data corresponding with the actuator identifier, and cause the output device to output the identified substantive actuator related data as human-perceptible signals.

8. The system of claim 1, wherein:
the mobile unit includes a memory storing multiple audio files;
the actuator related data comprises an audio file identifier; and
the mobile unit processor to receive the audio file identifier via the data transmission connection, identify a corresponding audio file of the multiple audio files, and cause the output device to output the identified audio file as the human-perceptible signals.

9. A system, comprising:
a base unit comprising:
  a capacitive coupling element located at, or proximate, a human-selectable actuator;
  a touch/proximity detection device comprising:
    a detection element located at, or proximate, the human-selectable actuator; and
    touch/proximity detection circuitry to detect touch/proximity events at the detection element, including a respective touch/proximity event comprising a person physically touching, or proximate, the detection element without actuating the human-selectable actuator; and
  a processor to initiate a communication sequence with a mobile unit in response to the detection of the touch/proximity event by the touch/proximity detection device, the communication sequence including a transmission to the mobile unit, via a data transmission connection including a capacitive coupling between the capacitive coupling element and the person, of actuator function information identifying an actuator function associated with the human-selectable actuator.

10. The system of claim 9, wherein the mobile unit comprises an output device to output human-perceptible signals based on the actuator function information received from the base unit via the data transmission connection.

11. The system of claim 10, wherein the output device comprises a speaker to output audio signals.

12. A method, comprising:
detecting, by a touch/proximity detection device of a base unit associated with a human-selectable actuator, a touch/proximity event by a person the touch/proximity event occurring at or proximate the human-selectable actuator but not actuating the human-selectable actuator;
in response to detecting the touch/proximity event, the base unit initiating a communication sequence including transmitting actuator related data from the base unit to a mobile unit via a data transmission connection between the base unit and the mobile unit, the actuator related data comprising information identifying an actuator function associated with the human-selectable actuator;
wherein the data transmission connection includes (a) a base unit-human capacitive coupling between the base unit and the person and (b) a mobile unit-human capacitive coupling between the mobile unit and the person, and passes through the person's body;
the mobile unit receiving the actuator related data transmitted via the data transmission connection; and
the mobile unit causing an output device to output human-perceptible signals indicating the actuator function associated with the human-selectable actuator based on the received actuator related data.

13. The method of claim 12, wherein the mobile unit causing an output device to output human-perceptible signals based on the received actuator related data comprises the mobile unit causing a speaker to output audible signals based on the received actuator related data.

14. The method of claim 12, comprising:
the mobile unit transmitting mobile unit data via the data transmission connection passing through the person's body, the mobile unit data comprising information associated with the mobile unit, or the person; and
the base unit receiving the mobile unit data via the data transmission connection.

\* \* \* \* \*